(12) United States Patent
Yeh

(10) Patent No.: US 9,120,392 B2
(45) Date of Patent: Sep. 1, 2015

(54) ELECTRONIC SPEED CONTROLLER WITH AUTOMATIC DETECTION FOR TYPE OF BATTERY

(71) Applicant: Shi-Tang Yeh, New Taipei (TW)

(72) Inventor: Shi-Tang Yeh, New Taipei (TW)

(73) Assignee: Jason Toys & Electronics Co. Ltd., New Taipei (TW)

( * ) Notice: Subject to any disclaimer, the term of this patent is extended or adjusted under 35 U.S.C. 154(b) by 177 days.

(21) Appl. No.: 13/954,306

(22) Filed: Jul. 30, 2013

(65) Prior Publication Data

US 2015/0002074 A1 Jan. 1, 2015

(30) Foreign Application Priority Data

Jun. 26, 2013 (TW) .............................. 102122867 A

(51) Int. Cl.
*H02J 7/00* (2006.01)
*B60L 11/18* (2006.01)

(52) U.S. Cl.
CPC .................................. *B60L 11/1838* (2013.01)

(58) Field of Classification Search
CPC .......................... B60L 11/1861; B60L 11/1862
USPC ....................................................... 320/106
See application file for complete search history.

(56) References Cited

U.S. PATENT DOCUMENTS

| 6,075,346 | A  | * | 6/2000  | Kikuchi et al. | ............... 320/150 |
| 6,333,620 | B1 | * | 12/2001 | Schmitz et al. | ............... 320/132 |
| 7,825,615 | B2 | * | 11/2010 | Chen et al. | ................... 318/139 |
| 8,111,038 | B2 | * | 2/2012  | Wang et al. | ................... 320/104 |
| 8,583,389 | B2 | * | 11/2013 | Aoshima et al. | ................ 702/63 |
| 2009/0069956 | A1 | * | 3/2009 | Taya et al. | ......................... 701/2 |
| 2009/0096399 | A1 | * | 4/2009 | Chen et al. | .................... 318/441 |
| 2010/0185405 | A1 | * | 7/2010 | Aoshima et al. | ................ 702/63 |
| 2011/0006731 | A1 | * | 1/2011 | Wang et al. | .................... 320/109 |
| 2014/0167657 | A1 | * | 6/2014 | Nishikawa | ..................... 318/139 |

* cited by examiner

*Primary Examiner* — Suchin Parihar
(74) *Attorney, Agent, or Firm* — Che-Yang Chen; Law Office of Michael Chen

(57) ABSTRACT

The present invention provides an electronic speed controller capable of detecting a battery type, which comprises a circuit board, a speed control module, a first detection socket, and a power socket. The speed control module has a first power management mode and a second power management mode. The first detection socket and the power socket are electrically connected with the speed control module. The former is provided to connect a first connector of a battery and the latter is provided to connect a second connector of the battery. The speed control module detects whether the first detection socket is in conductive status so as to determine the battery being a first type battery or a second type battery. If the battery is determined as the first type battery, the speed control module performs the first power management mode. Otherwise, the speed control module performs the second power management mode.

10 Claims, 7 Drawing Sheets

ELECTRONIC SPEED CONTROLLER WITH AUTOMATIC DETECTION FOR TYPE OF BATTERY

This application claims priority from Taiwan Patent Application No. 102122867, filed on Jun. 26, 2013 in Taiwan Intellectual Property Office, the contents of which are hereby incorporated by reference in their entirety.

FIELD OF THE INVENTION

The present invention relates to an electronic speed controller, and more particularly to the electronic speed controller with automatic detection for a type of battery and performing a corresponding power management mode.

BACKGROUND OF THE INVENTION

Most of electric RC cars adopt a battery as power supply, and allow users to replace the battery when the battery is exhausted. However, different types of batteries have different features. The service life of a battery may be shortened, or accidents, such as explosions and injuries, may occur if a battery is not used properly according to its features.

For example, if a lithium battery is discharged below its underlimit voltage level, the battery cannot be recharged anymore. If users install lithium batteries in their electric RC cars, they usually cannot observe the voltage level of the lithium batteries all the time during the operation of the electric RC cars. Therefore, an over-discharged and a low voltage may occur, and the lithium batteries may be unable to be recharged, thus incurs a loss to the users.

Currently, after installing a different type of battery in an electric RC car, the user has to reset the type of the new battery manually, such as setting the power mode of different batteries through an electronic device, a button, or a switch.

Some conventional electric RC cars need to be connected with a computer to download a software program for setting the battery type and the power management mode.

However, most electric RC cars are operated outdoors. The noise and sunlight have adverse influences on the manual setting methodology for the conventional electric RC car in battery type and power management mode and may result in incorrect setting and damage the battery. The traditional way of setting an electric RC car manually through an electronic device, a press button, or a switch, is very inconvenient.

Therefore, there is a need for a new technology that can detect the type of battery automatically and activate an appropriate power management mode.

SUMMARY OF THE INVENTION

The primary objective of the present invention is to provide an electronic speed controller capable of automatically detecting the type of a battery and performing a corresponding power management mode, so users no longer need to set the mode manually, instead simply connect batteries to electric RC cars or other electronic powered vehicles. The electronic speed controller of the present invention can automatically detect the type of battery and perform the most appropriate power management mode to prevent the battery from being damaged due to over-discharging caused by incorrect battery type setup, or utilizing inappropriate battery. This invention improves the convenience of usage significantly.

To achieve the objective of the present invention, the present invention, which provides an electronic speed controller with an automatic detection for the battery type, comprises a circuit board, a speed control module, a first detection socket, and a power socket. The speed control module, the first detection socket, and the power socket are installed on the circuit board. The speed control module includes a first power management mode and a second power management mode. The first detection socket is electrically coupled to the speed control module and connects to the first connector of a battery if applicable. The power socket is electrically coupled to the speed control module and connects to the second connector of the battery. Wherein, the speed control module detects whether the first detection socket is electrically connected to a battery in order to determine the battery to be the first type battery or the second type battery. If the battery is determined as the first type battery, the speed control module will perform the first power management mode; and if the battery is determined as the second type battery, the speed control module will perform the second power management mode.

Preferably, the first type battery is a nickel-hydrogen battery, and the second type battery is a lithium battery, and the nickel-hydrogen battery does not come with the first connector.

Preferably, the first detection socket includes a plurality of pins, and the speed control module further detects the voltage of each cell included in the battery pack through the pins.

Preferably, the speed control module performs a protection procedure for the voltage of each cell, and the protection procedure could be to emit warning sounds, to display a warning image, or to display a warning light signal.

Preferably, the electronic speed controller of the present invention could further include a second detection socket, and the number of pins of the second detection socket could be different from that of the first detection socket.

Preferably, no threshold voltage is set for the first type battery when the speed control module performs the first power management mode.

Preferably, when the speed control module performs the second power management mode, a threshold voltage is set for the second type battery to prevent the voltage from being too low or too high.

Preferably, the threshold voltage is determined according to the total voltage of the second type battery or the voltage of each cell of the second type battery.

Preferably, a plurality of threshold voltages are set and the speed control module performs a multi-stage management based on the threshold voltage settings.

Preferably, threshold voltages are determined according to the total voltage of the second type battery or the voltage of each cell in the second type battery.

BRIEF DESCRIPTION OF THE DRAWINGS

The technical characteristics, contents, advantages and effects of the present invention will be apparent with the detailed description of a preferred embodiment accompanied with related drawings as follows.

DESCRIPTION OF THE PREFERRED EMBODIMENTS

Figure 1:
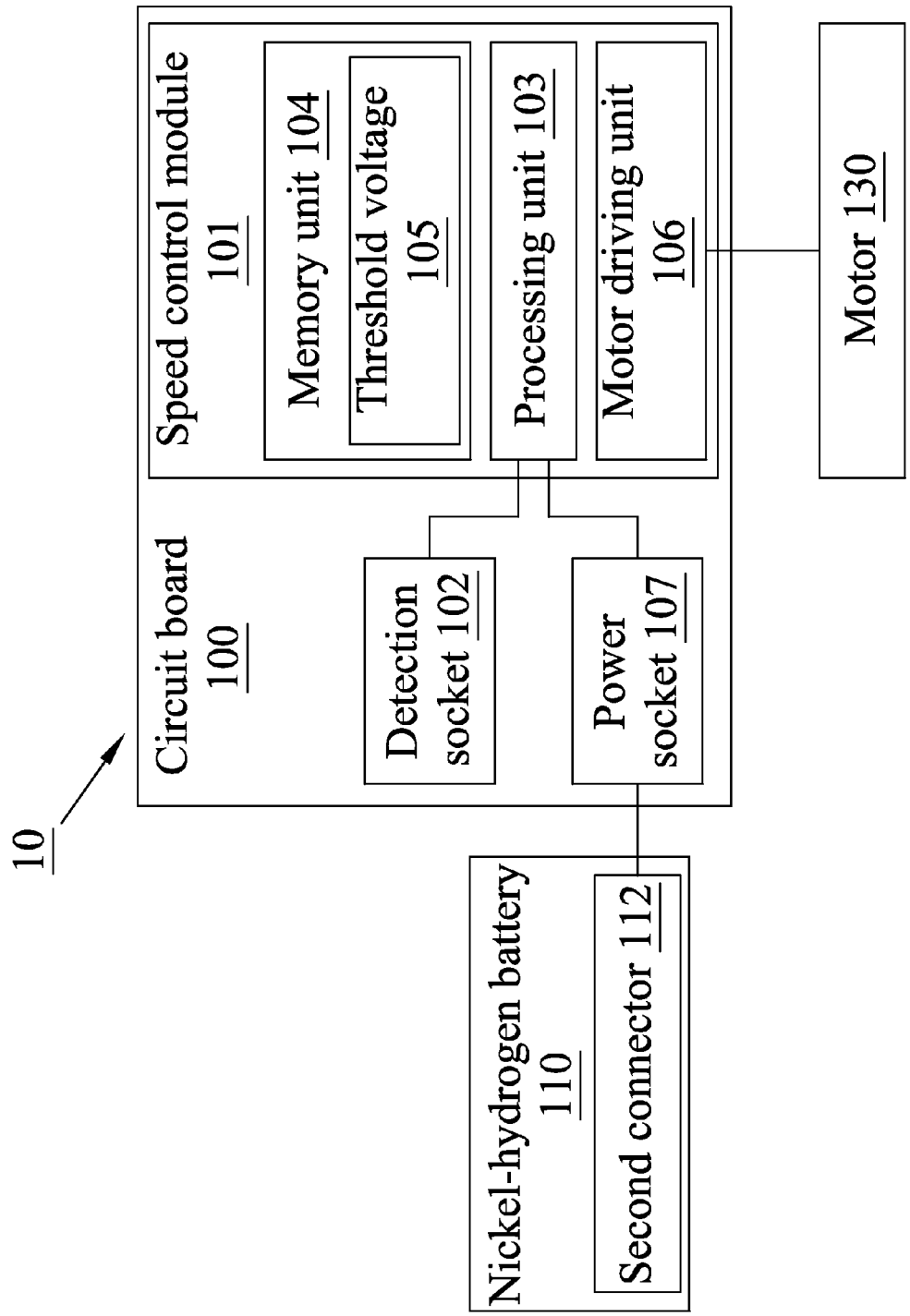
FIG. 1 is a block diagram of an electronic speed controller with the automatic detection for the type of a battery in accordance with a first preferred embodiment of the present invention.

The technical characteristics, contents, advantages and effects of the present invention will be apparent with the detailed description of a preferred embodiment accompanied with related drawings as follows. It is noteworthy that same numerals are used for representing respective same elements in the drawings.

Figure 2:
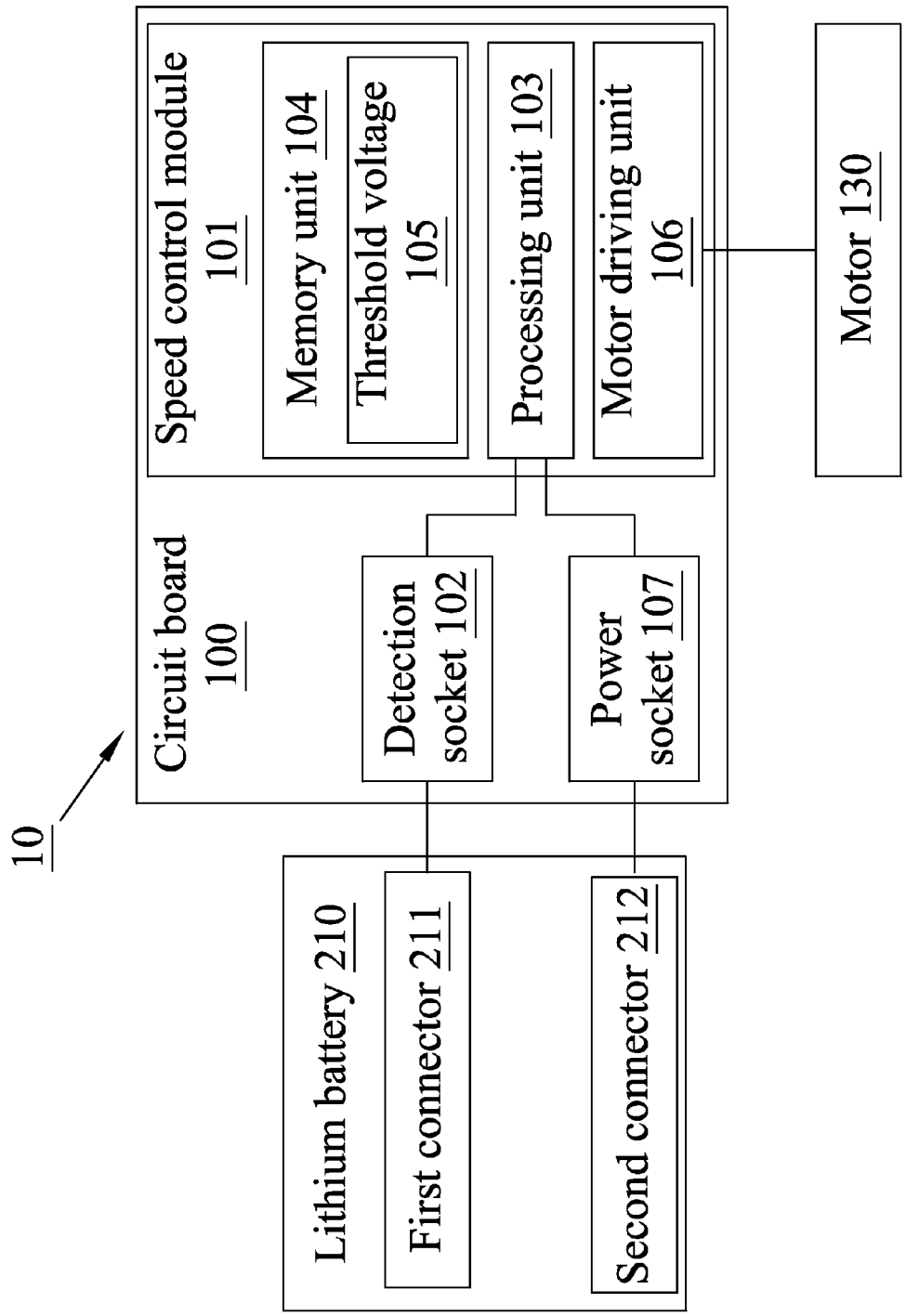
FIG. 2 is another block diagram of an electronic speed controller with the automatic detection for the type of a battery in accordance with the first preferred embodiment of the present invention.

With reference to FIG. 1 for a block diagram of an electronic speed controller with automatic detection for type of battery in accordance with the first preferred embodiment of the present invention, a nickel-hydrogen battery 110 is used as an example of a first type of battery as shown in FIG. 1, and a lithium battery 210 is used as an example of a second type of battery as shown in FIG. 2 for the purpose of illustrating the present invention.

In FIG. 1, the electronic speed controller 10 of the present invention comprises a circuit board 100, a speed control module 101, a detection socket 102, and a power socket 107. The speed control module 101, the detection socket 102, and the power socket 107 are installed on the circuit board 100. The speed control module 101 includes a processing unit 103, a memory unit 104 for storing a threshold voltage 105, and a motor driving unit 106. The detection socket 102 and the power socket 107 are electrically coupled to the speed control module 101.

In FIG. 1, the electronic speed controller 10 and the motor 130 are components of an electric RC car or any other moving devices, and the electric RC car is used as an example in this preferred embodiment for illustrating the invention, and the electric RC car comprises a car body, a plurality of wheels, and a wireless signal receiver. For simplicity, the aforementioned components are not drawn in FIGS. 1 and 2. The electric RC car further comprises a plurality of motors for driving the plurality of wheels respectively, and there is only one motor 130 shown in FIGS. 1 and 2, and the motor 130 can be a brush motor or a brushless motor.

The processing unit 103 of the speed control module 101 generates a pulse width modulation (PWM) signal and transmits the PWM signal to the motor driving unit 106. The motor driving unit 106 generates a motor driving voltage according to the PWM signal for driving and rotating the motor 130. Wherein, the processing unit 103 can change the motor driving voltage outputted from motor driving unit 106 by changing the duty cycle of the PWM signal to further control the rotation speed of the motor 130. The higher the motor driving voltage, the greater the rotation speed of the motor 130.

The power socket 107 is provided for connecting a battery and receiving an electric power of the battery. The processing unit 103 of the speed control module 101 controls the electric power supply to other components of the electric RC car, such as supplying electric power to the motor 130.

Different types of batteries have different numbers of connectors. For example, the nickel-hydrogen battery has only one connector, and both a charging process and a discharging process take place through the same connector, and the lithium battery has two connectors, one for discharging the battery and another for charging the battery.

In FIG. 1, the power socket 107 is provided for connecting the second connector 112 of the nickel-hydrogen battery 110, and the detection socket 102 has not been inserted into any connector yet. In FIG. 2, the connector 212 (which is a discharging connector) of the lithium battery 210 is plugged into the power socket 107; and the connector 211 (which is the charging connector) of the lithium battery 210 is plugged into the detection socket 102. Therefore, the detection socket 102 is provided for selectively plugging in a connector of a battery according to the type of battery used by a user.

The speed control module 101 can determine the type of battery used by the user through the electric connection of the detection socket 102 and selectively perform a first power management mode or a second power management mode. The detailed operation is described as follows.

If the battery used by a user is a nickel-hydrogen battery, then the connector of the battery is connected to the power socket 107 only as shown in FIG. 1. If the battery used by the user is a lithium battery, the discharging connector is plugged into the power socket 107 and the charging connector is plugged into the detection socket 102 as shown in FIG. 2. The present invention can detect the type of battery automatically by the aforementioned arrangements.

In the present invention, when a connector is plugged into the detection socket 102, the detection socket 102 is situated at an electrically connected status; and when no connector is plugged into the detection socket 102, the detection socket 102 is situated at an open-circuit status. Therefore, the speed control module 101 can determine whether the battery used is a first type battery (such as a nickel-hydrogen battery) or a second type battery (such as a lithium battery) by the electric connection of the detection socket 102.

When the nickel-hydrogen battery 110 is used, there is only one second connector 112 connecting to the power socket 107 without any other connector for plugging in the detection socket 102, so that the speed control module 101 determines the battery as a first type battery such as a nickel-hydrogen battery and executes a first power management mode, since the detection socket 102 is not electrically connected.

In FIG. 2, when a lithium battery 210 is used, the second connector 212 is connected to the power socket 107, and the first connector 211 can be plugged into the detection socket 102, so that the speed control module 101 can determine the type of battery is a second type battery such as a lithium battery and execute a second power management mode since the detection socket 102 is electrically connected.

Compared with the prior art, the preferred embodiment of the present invention simply requires users to connect all connectors to the corresponding positions of a battery for installing the battery. If the battery has only one connector, the connector can be connected to the power socket 107. If the battery has two connectors, then the discharging connector is connected to the power socket 107, and the charging connector is plugged into the detection socket 102. Therefore, the speed control module 101 of the present invention can detect the type of battery automatically without setting the type of battery manually, so as to improve the convenience of usage and battery protection.

Figure 3:
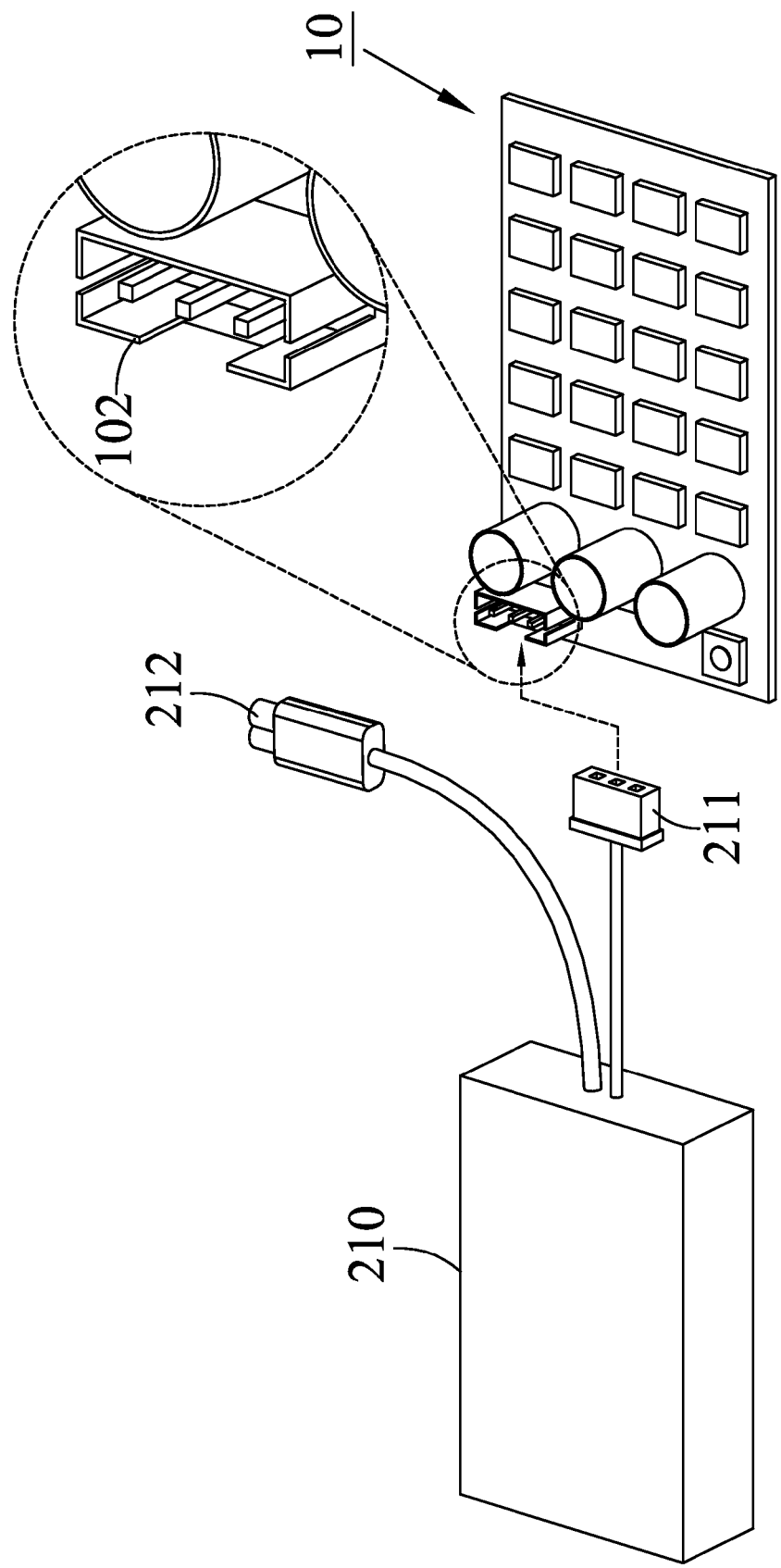
FIG. 3 is a schematic view of an electronic speed controller with the automatic detection for the type of a battery in accordance with the first preferred embodiment of the present invention.

With reference to FIG. 3 for a schematic view of an electronic speed controller with an automatic detection for the type of battery in accordance with a first preferred embodiment of the present invention, the detection socket 102 has three pins and the battery is a two-cell lithium battery. The speed control module 101 can detect the voltage of each cell of the battery 210 through the three pins. The threshold voltage 105 can be set according to the total voltage of the battery 210 or the voltage of each cell of the battery 210.

It is noteworthy that the quantity of pins of the detection socket is not limited to three, but any number corresponding to the number of cells of the battery can be used. For example, a 3-pin detection socket is applicable for a lithium battery having 2 cells, and a 4-pin detection socket is applicable for a lithium battery having 3 cells, and these are provided as examples for the propose of illustrating the invention only, but not intended for limiting the scope of the invention. The number of pins of the detection socket 102 of the present invention is available to various designs of batteries available in the market and can be changed accordingly. If the charging connector of a 2-cell lithium battery has only two insert holes, then the detection socket of the present invention can have only two pins, and the speed control module 101 can detect the voltage of each cell of the lithium battery of this sort through a ground terminal and the two pins.

To simplify the illustration of the relation between the first connector 211 and the detection socket 102 of the battery 210, the power socket 107 is not shown in FIG. 3. The power socket 107 of the present invention is actually situated on the electronic speed controller 10 and provided for connecting the second connector 212 of the battery 210. FIG. 3 is provided for the purpose of illustrating the invention, but not intended for limiting the scope of the invention.

Figure 4:
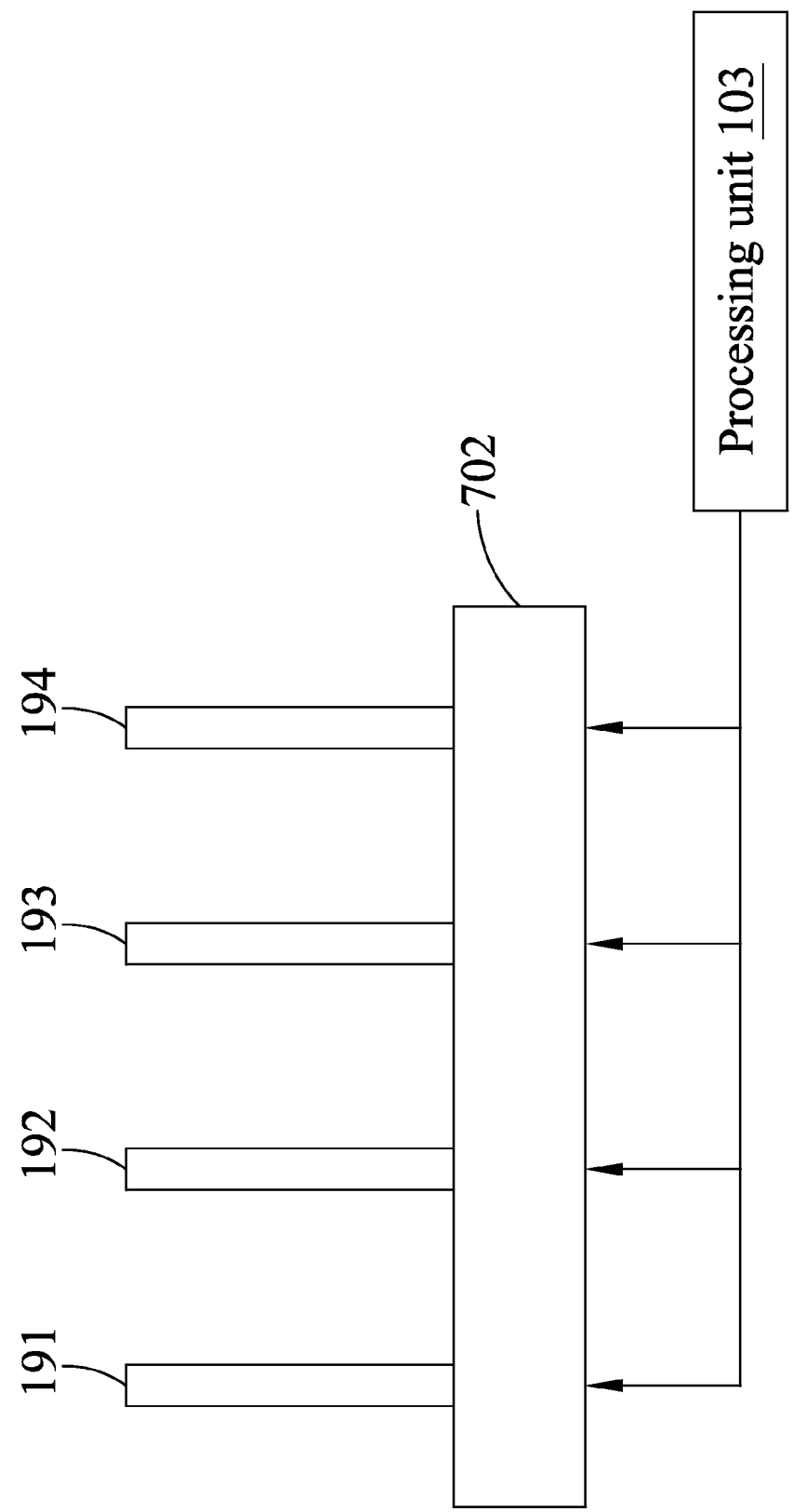
FIG. 4 is another schematic view of an electronic speed controller with the automatic detection for the type of a battery in accordance with the first preferred embodiment of the present invention.

In addition, the speed control module 101 can perform a protection procedure for the voltage of each cell as follows. With reference to FIG. 4 for the detailed description of the protection procedure carried out by the electronic speed controller of the present invention, a detection socket 702 with four pins 191, 192, 193, 194 is used for the purpose of illustrating the present invention, but not intended for limiting the scope of the invention.

In FIG. 4, the processing unit 103 of the electronic speed controller 10 is electrically coupled to the detection socket 702. The pins 191, 192, 193, and 194 are electrically coupled, wherein one of the pins is a ground pin such as the pin 191, so that the processing unit 103 can detect the voltage value of each pin 191, 192, 193, and 194. The processing unit 103 defines a normal range of the total voltage of the battery and a predetermined range of voltage values of each cell. In FIG. 4, when a fully-charged battery is connected, the pin 191 is a ground pin, and the total voltage between the pin 191 and the pin 194 is approximately equal to 12.6V, and the voltage of each cell, which is the voltage between the pin 191 and the pin 192, the pin 192 and the pin 193, or the pin 193 and the pin 194 is approximately equal to 4.2V. When the processing unit 103 detects an abnormal total voltage of the battery or the voltage of a single cell being too high or too low, the speed control module 101 will shutdown to protect the battery. When the total voltage of a battery including but not limited to three cells is greater than 13.1V or smaller than 9V, or the voltage of a single cell is greater than 4.45V or smaller than 3V, it indicates an abnormal situation of the battery, so that the speed control module 101 remains to be inoperable to protect the battery. The aforementioned voltage values are provided as examples, but the invention is not limited to these values only. The aforementioned values can be used for figuring out the total number of cells of a battery.

The electronic speed controller 10 of the present invention has a detection socket for automatically detecting the battery type to perform an appropriate power management mode as well as accurately determining any abnormal situation of the battery to stop the operation proactively. The aforementioned abnormal situations include a damaged battery, some damaged cells, a misuse of battery inserted with a wrong number of cells, and a broken pin of a connector, etc. For example, if a user plugs a charging connector of a lithium battery having two cells into the pin 191, the pin 192 and the pin 193 and, the processing unit 103 detects the voltage at the pin 194 falling beyond the predetermined voltage range, then the electronic speed controller 10 will not be turned on.

If the electronic speed controller 10 further comprises a sound generator or a beeper, the speed control module 101 will emit warning sounds to remind users about the possible problem in a cell of the battery. If the electronic speed controller 10 further comprises a display panel or at least one light emitting element (such as a light emitting diode, LED), the speed control module 101 can display a warning image or a warning light signal to remind the users through the display panel or at least one light emitting element.

Figure 5:
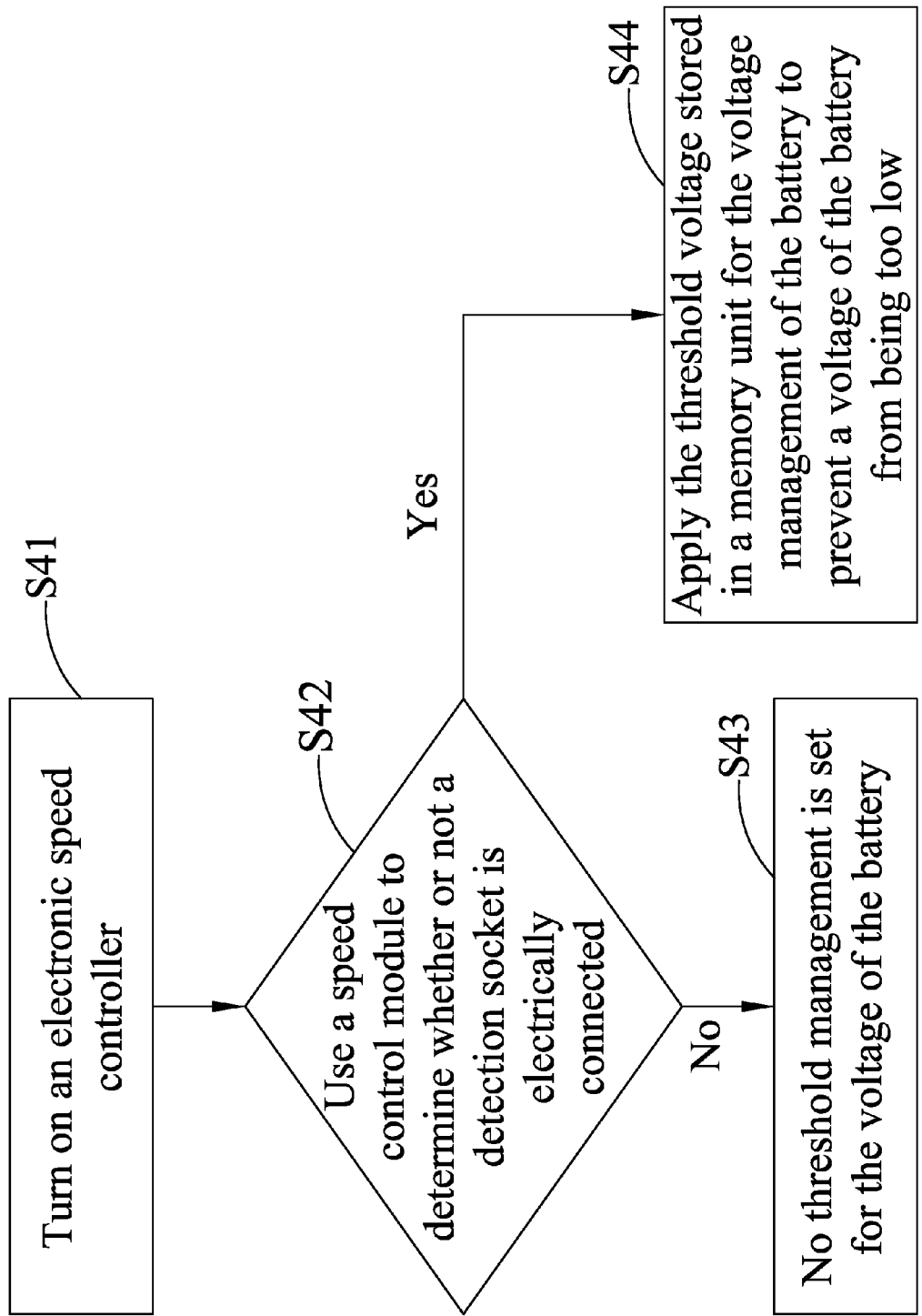
FIG. 5 is a flow chart of a second power management mode of an electronic speed controller with the automatic detection for the type of a battery in accordance with the first preferred embodiment of the present invention.

With reference to FIG. 5 for a flow chart of the power management of an electronic speed controller with an automatic detection for the type of battery in accordance with the first preferred embodiment of the present invention, the power management process comprises the following steps.

In step S41, an electronic speed controller 10 is turned on.

In step S42, a speed control module 101 is used to determine whether or not a detection socket 102 is electrically connected, if no, the battery used will be determined as a first type battery such as a nickel-hydrogen battery and Step 43 will be executed, or else Step 44 will be executed.

In step S43: no threshold management is set for the voltage of the battery, that is, a first power management mode is set.

S44: Determine the battery as a second type battery such as a lithium battery, and set a second power management mode. In other words, a threshold voltage 105 stored in a memory unit 104 is used for the voltage management of the battery to prevent a voltage of the battery from being too low. If the memory unit 104 includes a plurality of the threshold voltage 105 stored therein, the second power management mode can be a multi-stage management as described below.

Figure 6:
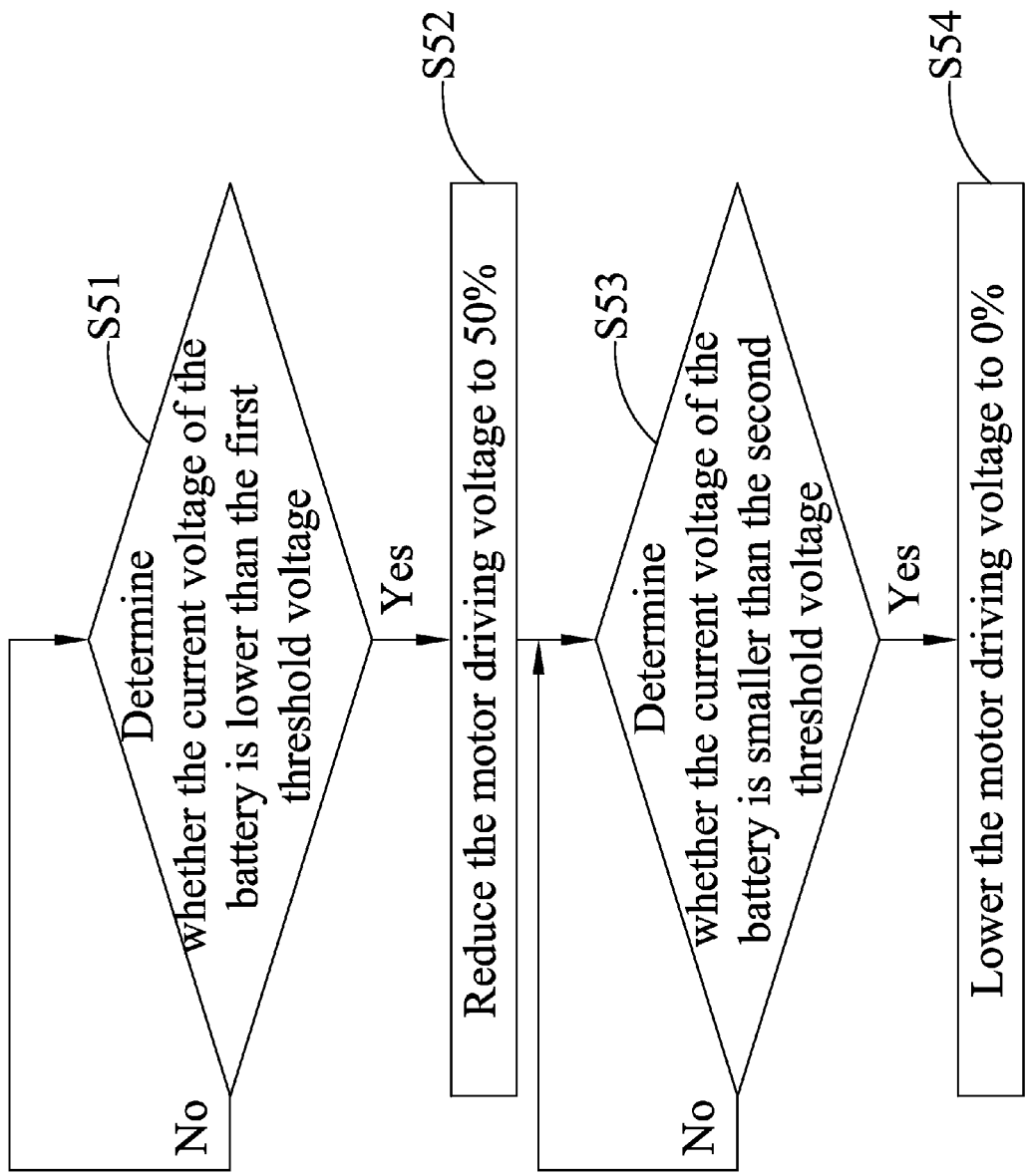
FIG. 6 is a flow chart of a multi-stage management of a second power management mode of an electronic speed controller with the automatic detection for the type of a battery in accordance with the first preferred embodiment of the present invention.

With reference to FIG. 6 for a flow chart of a second power management mode of an electronic speed controller with an automatic detection for the type of battery in accordance with the first preferred embodiment of the present invention, the threshold voltages listed in Table 1 are used as a reference for the multi-stage management. The contents included in Table 1 are provided for the purpose of illustrating the present invention, but the first threshold voltage and the second threshold voltage can be varies according to the number of cells of the battery.

TABLE 1

|  | First Threshold Voltage | Second Threshold Voltage |
| --- | --- | --- |
| Single-cell Battery | 3.66 V | 3 V |
| Two-cell Battery | 7.32 V | 6 V |
| Three-cell Battery | 10.98 V | 9 V |
| Four-cell Battery | 14.64 V | 12 V |

In FIG. 6, the second power management mode is carried out after the speed control module 101 determines the battery 210 as a second type battery.

In step S51, it determines whether or not the current voltage of the battery 210 is lower than the first threshold voltage; if yes, the step S52 is executed to lower the motor driving voltage to 50% and retard the consumption speed of the battery; otherwise, the step S53 is executed.

Because the processing unit 103 of the present invention can detect the voltage of a single cell, therefore in the step S51 it also can determine whether or not the total voltage of the battery 210 is smaller than the first threshold voltage, upon the demand, as well as determine whether or not the voltage of each cell in the battery 210 is smaller than the first threshold voltage of the cell. If any one of the aforementioned determinations is affirmative, then the step S52 will be executed.

For a two-cell battery, Table 1 shows that the first threshold voltage of the total voltage of the battery is 7.32V, and the first threshold voltage of the cell is 3.66V. For a three-cell battery, Table 1 shows that the first threshold voltage of the total voltage of the battery is 10.98V, and the first threshold voltage of the cell is 3.66V.

In step S53, it determines whether or not the current voltage of the battery 210 is lower than the second threshold voltage; if yes, the step S54 is executed, or else, the step S53 is executed.

In step S54, the motor driving voltage is lowered to 0%. Now, the speed control module 101 no longer drives the motor to rotate, but the electric RC car is still moving by inertia, so that a user can still control the moving direction of the electric RC car remotely to drive back the electric RC car to the user.

Preferably, the processing unit 103 of the present invention can detect the voltage of a single cell, so that the step S53 can include the step of determining whether the total voltage of the battery 210 is smaller than the second threshold voltage of the battery, as well as determining whether the voltage of each cell of the battery 210 is smaller than the second threshold voltage of the cell. If any one of the aforementioned determinations is affirmative, then the step S52 will be executed.

For a two-cell battery, Table 1 shows that the second threshold voltage of the total voltage of the battery total voltage is 6V, and the first threshold voltage of the cell is 3V. For a three-cell battery, Table 1 shows that the first threshold voltage of the total voltage of the battery is 9V, and the first threshold voltage of the cell is 3V.

As shown in FIG. 6, although the second power management mode is a two-stage management, the invention is not limited to such arrangement only. Additional lower third threshold voltage can be set. If the current voltage of the battery 210 is smaller than the third threshold voltage, the power supplied from the battery to the wireless signal receiver will be disconnected. Now, the battery 210 can be protected, even though the user cannot control the direction of the electric RC car anymore. Therefore, the second power management mode of the present invention can set a plurality of threshold voltages as needed, and the protection mechanism corresponding to each threshold voltage is not limited to those disclosed in the foregoing preferred embodiments.

Figure 7:
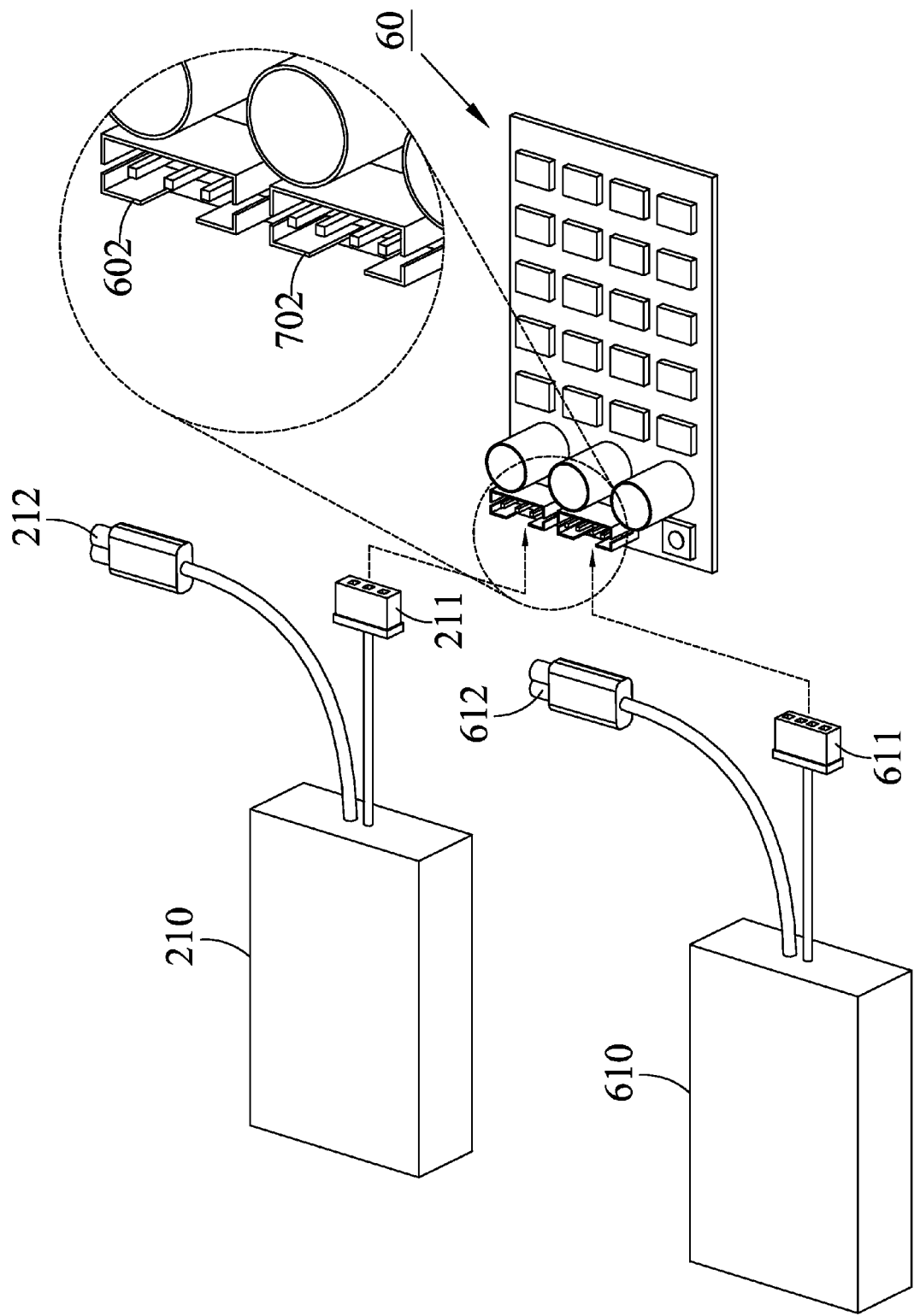
FIG. 7 is a schematic view of an electronic speed controller with the automatic detection for the type of a battery in accordance with a second preferred embodiment of the present invention.

With reference to FIG. 7 for a schematic view of an electronic speed controller with an automatic detection for the type of battery in accordance with the second preferred embodiment of the present invention, the electronic speed controller of the present invention comes with a plurality of detection sockets and a plurality of power sockets to cope with the plurality of batteries installed by the user and improve the performance of the electric RC car, wherein each detection socket has the same number or different number of pins. In FIG. 6, the electronic speed controller 60 has a three-pin detection socket 602 and a four-pin detection socket 702. The three-pin detection socket 602 is applicable for a two-cell battery 210, and the four-pin detection socket 702 is applicable for a three-cell battery 610. Therefore, the users can plug the first connectors 211 and 611 into the detection sockets 602 and 702 respectively, and connect the second connectors 212 and 612 to two power sockets (not shown in the figure) of the electronic speed controller 60 respectively so as to connect the battery 210 in series with the battery 610. The electronic speed controller 60 can perform a power management by detecting the voltage of each cell in the battery 210 and the battery 610. The power management of the electronic speed controller 60 of this embodiment is the same as that of the previous embodiment, so its description is omitted.

Although the electronic speed controller of the present invention is applied in an electric RC car as described above, the application of the present invention is not limited to the electric RC cars only, but any other moving device using a battery as a power supply as well as the electronic speed controller also falls within the scope of the present invention.

While the invention has been described by means of specific embodiments, numerous modifications and variations could be made thereto by those skilled in the art without departing from the scope and spirit of the invention set forth in the claims.

What is claimed is:

1. An electronic speed controller with automatic detection for the type of a battery, comprising:
    a circuit board;
    a speed control module, installed on the circuit board, and including a first power management mode and a second power management mode;
    a first detection socket, installed on the circuit board, and electrically coupled to the speed control module for selectively connecting to a first connector of the battery;
    a power socket, installed on the circuit board, and electrically coupled to the speed control module for connecting a second connector of the battery,
    wherein the speed control module detects whether the first detection socket is electrically connected to determine if the battery is a first type battery or a second type battery, wherein the first type battery is only arranged with the second connector, and the second type batter is arranged with both the first connector and the second connector; and
    if the battery is determined as the first type battery, the speed control module will perform the first power management mode; and if the battery is determined as the second type battery, the speed control module will perform the second power management mode.

2. The electronic speed controller of claim 1, wherein the first type battery is a nickel-hydrogen battery and the second type battery is a lithium battery, and the nickel-hydrogen battery does not come with the first connector.

3. The electronic speed controller of claim 1, wherein the first detection socket comprises a plurality of pins, and the speed control module detects the voltage of each cell included in the battery through the plurality of pins.

4. The electronic speed controller of claim 1, wherein the speed control module performs a protection procedure for the voltage of each cell, and the protection procedure comprises warning sounds, a warning image, or a warning light signal.

5. The electronic speed controller of claim 3, further comprising a second detection socket, and the number of pins of the second detection socket is different from that of the first detection socket.

6. The electronic speed controller of claim 1, wherein no threshold is set for the voltage of the first type battery when the speed control module performs the first power management mode.

7. The electronic speed controller of claim 1, wherein when the speed control module performs the second power management mode, a threshold voltage is set for the voltage of the second type battery to prevent the second type battery from being too low or too high.

8. The electronic speed controller of claim 7, wherein the threshold voltage is designed according to the total voltage of the second type battery and the voltage of each cell of the second type battery.

9. The electronic speed controller of claim 7, wherein a plurality of threshold voltages are set, and the speed control module performs a multi-stage management based on the plurality of threshold voltages.

10. The electronic speed controller of claim 9, wherein the plurality of threshold voltages are designed according to the total voltage of the second type battery or the voltage of each cell of the second type battery.

* * * * *